United States Patent [19]

Chaprnka et al.

[11] 4,075,559
[45] Feb. 21, 1978

[54] TECHNIQUE FOR EXTENDING THE RANGE OF A SIGNAL MEASURING CIRCUIT

[75] Inventors: Anthony G. Chaprnka, Cockeysville, Md.; Shan C. Sun, Pittsburgh; Leonard C. Vercellotti, Verona, both of Pa.

[73] Assignee: Westinghouse Electric Corporation, Pittsburgh, Pa.

[21] Appl. No.: 598,611

[22] Filed: July 24, 1975

[51] Int. Cl.² .................. G01R 15/08; G01R 17/06; H04B 1/64
[52] U.S. Cl. .................. 324/115; 324/99 R; 333/14
[58] Field of Search .................. 324/115, 132, 99 R, 324/99 D; 328/145, 144, 143; 307/230; 333/14

[56] References Cited

U.S. PATENT DOCUMENTS

| | | | |
|---|---|---|---|
| 2,065,489 | 12/1936 | Etzrodt | 333/14 |
| 3,095,535 | 6/1963 | Jaffe et al. | 324/99 D |
| 3,159,787 | 12/1964 | Sexton et al. | 324/132 |
| 3,724,954 | 4/1973 | Dreyfoos, Jr. | 328/145 |

*Primary Examiner*—Rudolph V. Rolinec
*Assistant Examiner*—Ernest F. Karlsen
*Attorney, Agent, or Firm*—M. P. Lynch

[57] ABSTRACT

An input signal supplied to a signal measuring circuit is either amplified or attenuated as necessary to establish the magnitude of the input signal within the defined dynamic range of the measuring circuit and the output signal developed by the measuring circuit is subsequently readjusted through amplification or attenuation to develop an output signal which corresponds to the magnitude of the initial input signal.

6 Claims, 5 Drawing Figures

TECHNIQUE FOR EXTENDING THE RANGE OF A SIGNAL MEASURING CIRCUIT

This invention resulted from work performed under the United States Energy Research and Development Administration Contract No. W-31-109-38.

CROSS REFERENCE TO RELATED APPLICATION

This application is related to cofiled, copending patent application Ser. No. 598,609 (W. E. Case 46,124), filed July 24, 1975, entitled An Improved Logarithmic Measuring Circuit, and assigned to the assignee of the present invention.

BACKGROUND OF THE INVENTION

The basic measuring circuit which is designed to monitor an input signal whose magnitude varies with time is inherently limited to a specific useful range. When the performance requirement of a particular application is beyond the capability of the basic measuring circuit, auxiliary circuits are required. These additional circuits may include an input range switching circuit (manual or automatic) or a dynamic feedback circuit having a function equivalent to a continuous automatic gain control (AGC) circuit. The requirement for low noise, wide-band frequency response and good linearity, make the designs of these auxiliary circuits complex and expensive.

SUMMARY OF THE INVENTION

There is disclosed herein with reference to the accompanying drawings a relatively simple technique for adjusting the magnitude of an input signal to a level within the defined dynamic range of a measuring circuit, such as RMS, DC, peak-to-peak, etc., and subsequently readjusting the output signal of the measuring circuit to a level comparable to the magnitude of the input signal. This permits the most efficient use of the measuring circuit to achieve desired linearity and response characteristics over an extended range of input signals.

In the event the input signal is of a magnitude below the minimum of the dynamic range of the measuring circuit, a suitable amplifier circuit is used to increase the magnitude of the input signal so as to establish it within the dynamic range of the measuring circuit. Subsequently, an attenuating circuit at the output of the measuring circuit decreases the magnitude of the output signal from the measuring circuit to a level comparable to the initial magnitude of the input signal. In the event the initial magnitude of the input signal is greater than the upper limit of the dynamic range of the measuring circuit, an attenuating circuit would be used at the input of the measuring circuit and an amplifier circuit used at the output of the measuring circuit.

A particularly useful and simple implementation of this basic technique is disclosed as utilizing a pair of matched photoresistors. The resistance characteristics of the photoresistors, which are illuminated equally by a common light source, varies inversely with the received light intensity. One of the photoresistors is used at the input of the measuring circuit, herein illustrated as an RMS measuring circuit, to suitably adjust the magnitude of the input signal to the measuring circuit while the second photoresistor is connected at the output of the measuring circuit to provide the necessary compensation of the magnitude of the output signal of the measuring circuit. A light source amplifier circuit, which continuously monitors the output signal from the measuring circuit and provides dynamic drive to the photoresistors, serves as a feedback control for the photoresistors and further determines the required automatic gain control (AGC) range of the circuit. In accordance with application requirements, the design of the circuitry can be such that the light output of the common light source can be made either directly or inversely proportional to the output signal from the measuring circuit.

The photoresistor provides wide band frequency response and low noise inasmuch as the photoresistor is essentially a passive element and contains only resistive components. Further, good linearity is realized through the use of a matched pair of photoresistors inasmuch as the error in input/output transfer contributed by the photoresistors is entirely dependent upon the matching of the photoresistors. In practice, this matching can be made with great accuracy and is not limited by any inherent nature of the photoresistors.

The technique for extending the useful range of a conventional measuring circuit, and in particular, a scheme utilizing a matched pair of photoresistors is described in detail with reference to the accompanying drawings.

DESCRIPTION OF THE DRAWINGS

The invention will become more readily apparent from the following exemplary description in connection with the accompanying drawings.

DESCRIPTION OF THE PREFERRED EMBODIMENT

Figure 1:
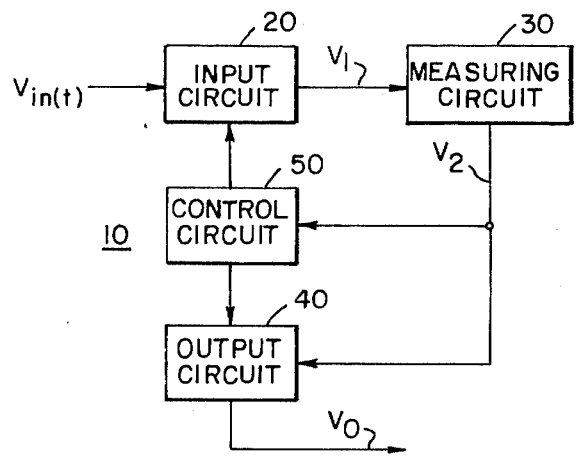
FIG. 1 is a basic block diagram of the invention.

Referring to FIG. 1, there is illustrated in a basic block diagram a measuring circuit 10 consisting of an input signal conditioning circuit 20, an RMS to DC converter 30, an output signal conditioning circuit 40 and a feedback control circuit 50. The RMS to DC converter 30 responds to an input voltage signal $V_1$ supplied through input signal conditioning circuit 20 by developing a DC output signal indicative of the RMS value of the input voltage signal $V_{in(t)}$ which varies with time. Typical commercially available RMS and DC converters include Intronics circuit R310 and Analog Devices circuit AD440. The feedback control circuit 50 responds to the output signal $V_2$ from the RMS to DC converter 30 by supplying a control signal to the input signal conditioning circuit 20 to modify the magnitude of the input signal $V_{in(t)}$ to produce an output signal $V_1$ from the circuit 20 of a magnitude which is within the defined dynamic range of the RMS to DC converter 30. The feedback control circuit 50 likewise supplies a control signal to the output signal conditioning circuit 40 which further accepts as an input signal the output signal $V_2$ from the RMS DC converter 30. The output signal conditioning circuit 40 responds to the control signal by adjusting the magnitude of signal $V_2$ by an amount identical to the adjustment made by the input signal conditioning circuit 20 but of an opposite polarity such that the output signal $V_o$ is a DC signal indicative of the RMS value of the input signal $V_{in(t)}$.

Figure 5:
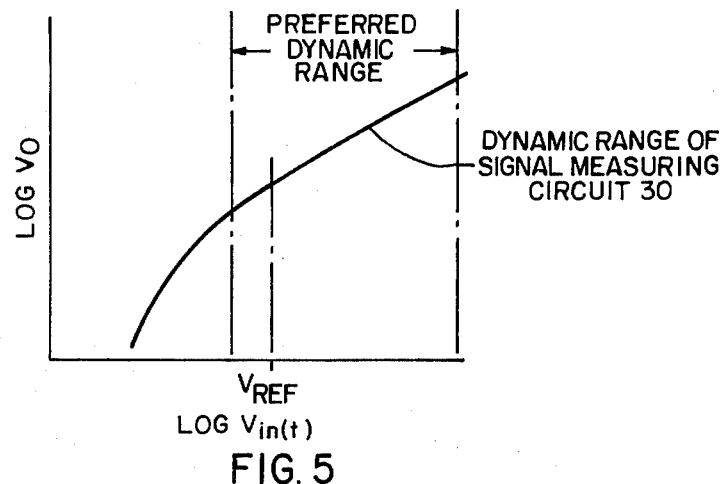
FIG. 5 is a graphical representation of the dynamic range of a measuring circuit.

The defined dynamic range of the RMS to DC converter circuit 30, is illustrated in FIG. 5 as a log-log plot of $V_o$ versus $V_{in(t)}$. It is apparent from the graphical illustration of FIG. 5, that optimum performance of the RMS to DC converter circuit 30 is achieved when the magnitude of the signal supplied to the RMS to DC converter circuit 30 falls within the defined dynamic range. The function of the input signal conditioning circuit 20 is to adjust the magnitude of the actual input signal $V_{in(t)}$ to establish an input signal $V_1$ to the RMS to DC converter circuit 30 which is in fact, within the defined dynamic range of the RMS to DC converter circuit 30.

The feedback control circuit 50 simultaneously provides the necessary control signals to the input signal conditioning circuit 20 to establish the signal within the defined dynamic range while providing a control signal to the output signal conditioning circuit 40 which functions in an opposite manner to that of the input signal conditioning circuit 20 so that the output signal $V_o$ of circuit 10 is an accurate indication of the RMS value of the input signal $V_{in(t)}$. It is apparent that if the magnitude of the actual input signal $V_{in(t)}$ is less than that required to establish it within the defined dynamic range of the RMS to DC converter 30, that the input signal conditioning circuit 20 will be designed to function as an amplifier, while the output signal conditioning circuit 40 will be designed to function as an attenuator. If the magnitude of the actual input signal $V_{in(t)}$ is greater than that corresponding to the defined dynamic range of the RMS to DC converter 30, the input signal conditioning circuit 20 will be designed to function as an attenuator while the output signal conditioning circuit 40 will be designed to function as an amplifier.

The disclosure of this basic concept for extending the useful range of an RMS to DC converter circuit will stimulate numerous circuit variations for implementing specific embodiments of the concept, such as the use of digitally-controlled resistor networks in circuits 20 and 40 wherein the feedback control circuit will function to digitally increase the resistance in one circuit while simultaneously digitally decreasing the resistance of like amount in the other circuit to achieve the desired combination of amplification and attenuation. There is disclosed hereinafter with reference to FIGS. 2-4, a preferred embodiment utilizing light actuated photoresistors.

It will be assumed for the purposes of the following discussion that the input signal $V_{in(t)}$ is of a magnitude less than that required to establish it within the defined dynamic range of the RMS to DC converter circuit 30. Thus, the input signal conditioning circuit 20 will function to increase the magnitude of input signal $V_{in(t)}$ while the output signal conditioning circuit 40 will function to decrease the magnitude of the output signal $V_2$ from the RMS to DC converter circuit 30.

Figure 2:
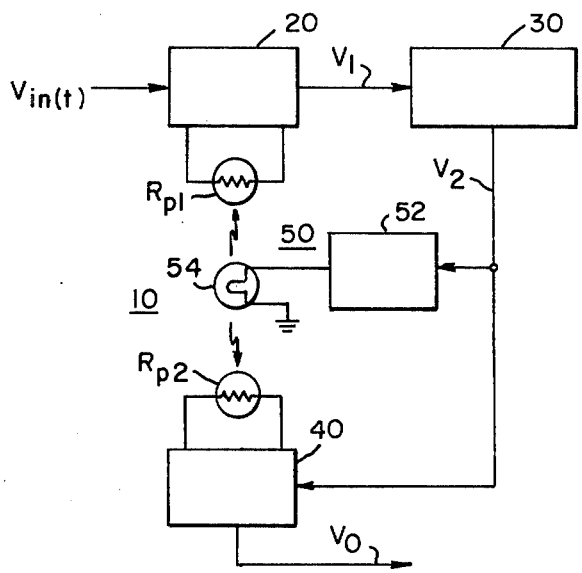
FIG. 2 is a schematic illustration of an embodiment of the invention of FIG. 1 utilizing a matched pair of photoresistors.

The variable electrical components in the circuits 20 and 40 of FIG. 2 are illustrated as consisting of photoresistor $R_{p1}$ and photoresistor $R_{p2}$, respectively. The photoresistors $R_{p1}$ and $R_{p2}$ are closely matched as to operational characteristics, and are typically made from cadmium sulfide (CdS) or cadmium selenium (CdSe) material having a characteristic such that the resistance varies inversely with the intensity of impinging light. The feedback control circuit 50 of FIG. 2 consists of a light source amplifier 52 and a light source 54, such as a light emitting diode, which serves as a common light source to equally illuminate the photoresistors $R_{p1}$ and $R_{p2}$.

If it is assumed for the purposes of discussion, that the photoresistor $R_{p1}$ provides a dynamic amplification factor K for the input signal conditioning circuit 20, then it necessarily follows that the photoresistor $R_{p2}$ provides attenuation factor of 1/K for the output signal conditioning circuit 40. The K factor can be made either linearly or inversely proportional to the resistance of the photoresistor.

The light source amplifier circuit 52 of the feedback control circuit 50 continuously monitors the output signal $V_2$ of the RMS to DC converter circuit 30 and provides dynamic drive to the photoresistors $R_{p1}$ and $R_{p2}$. Depending on the design of circuits 20 and 40, the light output of the light source 54 can also be made either directly or inversely proportional to the output of the RMS to DC converter circuit 30. The feedback control circuit 50, as illustrated in FIG. 2, functions to determine the required automatic gain control (AGC) for the circuit end.

In the embodiment of FIG. 2, a relatively low magnitude input signal $V_{in(t)}$ will result in a light output from the light source 54 which will increase the factor K by decreasing the quantity of impinging light until the magnitude of the signal $V_1$ applied to the RMS to DC converter circuit 30 is within the defined dynamic range of the circuit 30. As the magnitude of the input signal $V_{in(t)}$ increases, the light output from the light source 54 will decrease causing the K factor to decrease inasmuch as less amplification and attenuation by the circuits 20 and 40 respectively is required. Thus, while the input signal $V_{in(t)}$ may vary over a wide range, the variation of the signal $V_1$ is limited to within the defined dynamic range of the RMS to DC converter circuit 30. Consequently, the useful range of operation of the RMS to DC converter circuit 30 is extended. It is also evident that the amount of range extension achieved by the circuits 20, 40 and 50 depends on the dynamic range of the factor K. In practice, using a single matched pair of photoresistors, a reasonable dynamic range for factor K is about 40 dB or a ratio of approximately 100 to 1. This implies that a 40 Db range extension for a conventional RMS to DC converter circuit can be obtained. The operation of the embodiment of FIG. 2 to achieve an output signal $V_o$ which is a DC representation of the RMS value of the input signal $V_{in(t)}$ can be expressed as follows:

$$V_2 = K \cdot \sqrt{[V_{in(t)}]^2}$$

$$V_o = V_2 \cdot (1/K)$$

$$V_o = \sqrt{[V_{in(t)}]^2}$$

Figure 3:
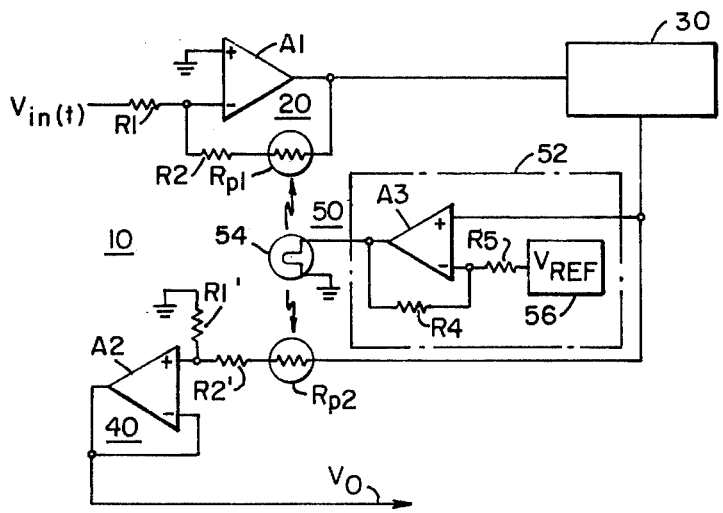
FIGS. 3 and 4 are schematic illustrations of variations of the embodiment of FIG. 2.

The embodiment of FIG. 2 is illustrated in further detail in FIG. 3 wherein operational amplifiers A1, A2 and A3 provide the basic circuitry for the input signal conditioning circuit 20, output signal conditioning circuit 40 and feedback control circuit 50 respectively. In the embodiment of FIG. 3, wherein the input signal conditioning circuit 20 functions as an emplifier, the operational amplifier A1 functions as an automatic gain control amplifier having a gain which is established by the fixed resistors R1 and R2 and the variable resistor represented by a photoresistor $R_{p1}$. The minimum gain for the operational amplifier A1 is achieved under maximum light output from the light source 54 which produces the minimum resistance characteristic for the photoresistor $R_{p1}$. Maximum gain for the operational amplifier A1 is achieved when the light output from the light source 54 is at a minimum.

And the output signal conditioning circuit 40, the photoresistor $R_{p2}$ is connected in series with the input resistor $R_2'$ of the DC amplifier A2. The connection of the photoresistors $R_{p1}$ and $R_{p2}$ in combination with the amplifiers A1 and A2 respectively establish the dynamic amplification factor K for circuit 20 and the attenuation factor 1/K for circuit 40.

The operational amplifier A3 of the feedback control circuit 50 is connected to function as a differential amplifier wherein one input corresponds to the output signal $V_2$ from the RMS to DC converter circuit 30 and the second input corresponds to reference voltage level $V_{ref}$ developed by the voltage reference source 56. The amplifier A3 functions to compare the signal $V_2$ developed by the RMS to DC converter circuit 30 to the reference voltage level $V_{ref}$ which is indicative of a signal magnitude within the defined dynamic range of the RMS to DC converter circuit 30 as illustrated in FIG. 6. Deviations of the signal $V_2$ from the reference voltage level $V_{ref}$ will produce a corresponding change in the light output of the light source 54 so as to reestablish substantial coincidence between the magnitude of the signal $V_2$ and the reference voltage $V_{ref}$.

An input signal $V_{in(t)}$ having a magnitude less than $V_{ref}$ will decrease the light output from the light source 54 thus increasing the resistance of photoresistors $R_{p1}$ and $R_{p2}$. This results in an increase in amplification of the signal $V_{in(t)}$ supplied as signal $V_1$ to the RMS to DC converter circuit 30 and increased attenuation of the signal $V_2$ by the output signal conditioning circuit 40. Conversely, if the signal $V_2$ from the RMS to DC converter circuit is of a magnitude greater than the $V_{ref}$ the light output from the light source 54 will be high and the resistance of photoresistors $R_{p1}$ and $R_{p2}$ will be low.

The operation of the embodiment of the RMS measuring circuit 10 of FIG. 3 can be represented as follows:

$$V_1 = -[(R_2 + R_{p1})/R_1] \cdot V_{in(t)}]$$

$$V_2 = [(R_2 + R_{p1})/R_1] \cdot \sqrt{[V_{in(t)}]^2}$$

$$V_o \approx [(R_2 + R_{p1})/R_1] \cdot [R_2/(R_2 + R_{p2})] \cdot \sqrt{[V_{in(t)}]^2}$$

since $R_{p1} = R_{p2}$, if $R_1$ is made equal to $R_2$ then:

$$V_o = \sqrt{[V_{in(t)}]^2}$$

Figure 4:
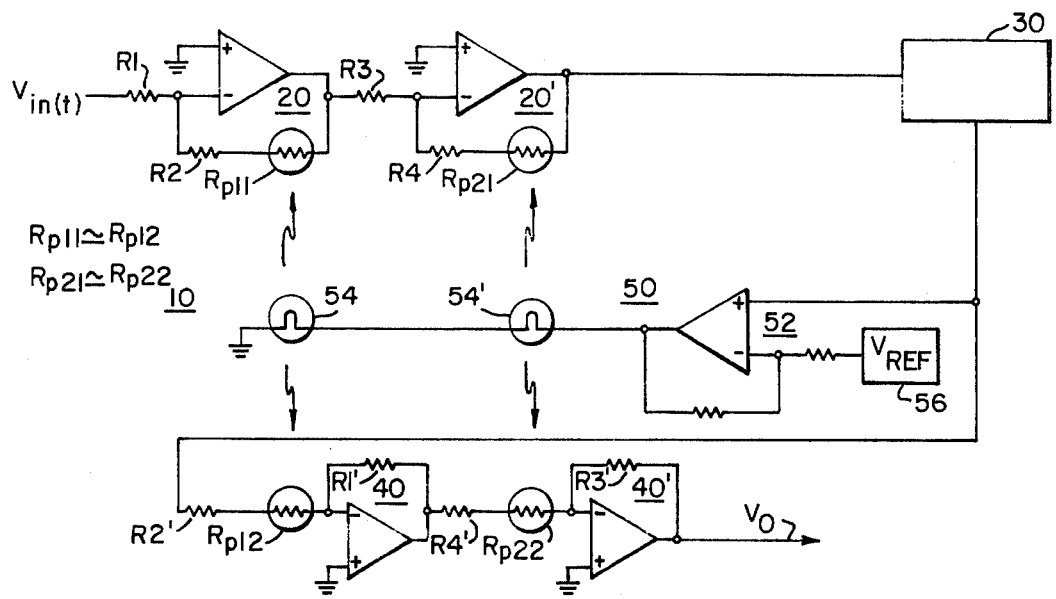

In the event it is desired to further extend the useful range of the RMS to DC converter circuit 30, additional matched pairs of photoresistors may be incorporated in the basic embodiment of FIG. 3. An embodiment of this type is schematically illustrated in FIG. 4 wherein two input signal conditioning circuits 20 and 20' are connected in a cascade series arrangement and two output signal conditioning circuits 40 and 40' are connected in a cascade series arrangement. A first light source 54 responds to the output of the light amplifier circuit 52 by illuminating photoresistors $R_{p11}$ and $R_{p12}$ of circuits 20 and 40 respectively, while a second light source 54' responds to the output of the light amplifier circuit 54 by illuminating photoresistors $R_{p21}$ and $R_{p22}$ of circuits 20' and 40' respectively. In the embodiment illustrated in FIG. 3 it is only necessary that the operational characteristics of the photoresistor $R_{p11}$ be the same as the operational characteristics of the photoresistor $R_{p12}$, while the operational characteristics of photoresistor $R_{p21}$ be the same as the operational characteristics of photoresistor $R_{p22}$.

As stated above the selection of an RMS to DC converter in the embodiments of FIGS. 1-4 was merely to illustrate the inventive concept of extending the useful range which is equally applicable to any one of numerous signal measuring circuits.

We claim:
1. The combination of:
a signal measuring circuit means having an input and an output, and a defined dynamic range;
an input circuit means connected to said input of said signal measuring circuit means, said input circuit means adjusting the magnitude of an input signal to a level within said defined dynamic range, the resulting adjusted signal being supplied to said signal measuring circuit means, said signal measuring circuit means producing a first output signal corresponding to a measured characteristic of the adjusted signal;
an output circuit means connected to the output of said signal measuring circuit means to adjust the magnitude of said first output signal to a level corresponding to said input signal to produce a second output signal indicative of the measured characteristic of said input signal; and
a control circuit means connected for producing first and second control signals, said input circuit means responding to said first control signal by adjusting the magnitude of said input signal a predetermined amount in a first direction and said output circuit means responding to said second control signal by adjusting the magnitude of said first output signal said predetermined amount in the opposite direction to produce said second output signal.

2. The combination as claimed in claim 1 wherein said input circuit means includes a first photoresistor and said output circuit means includes a second photoresistor, and said control circuit means includes a light source for simultaneously directing light energy onto said photoresistors, the intensity of said light energy being a function of the magnitude of said first output signal, said first photoresistor responding to a change in light energy by changing the electrical characteristics of said input circuit means to adjust the magnitude of said input signal a predetermined amount in a first direction, said second photoresistor responding to said change in light energy by changing the electrical characteristics of said output circuit means to adjust the magnitude of said first output signal said predetermined amount in the opposite direction.

3. The combination as claimed in claim 1 wherein said control circuit means includes a comparator circuit means for comparing said first output signal with a reference signal indicative of the dynamic range of said signal measuring circuit means to develop a first control signal to establish the magnitude of said adjusted signal within said dynamic range.

4. The combination of claim 2 wherein said first and second photoresistors form a matched pair of photoresistors.

5. The combination of claim 4 wherein said input and output circuit means include more than one matched pair of photoresistors.

6. The combination of claim 5 wherein said control circuit means includes a separate light source for each matched pair of photoresistors.

* * * * *